United States Patent
Raina et al.

(10) Patent No.: US 9,287,006 B2
(45) Date of Patent: Mar. 15, 2016

(54) SYSTEM AND METHOD FOR TESTING ADDRESS-SWAP FAULTS IN MULTIPORT MEMORIES

(71) Applicant: FREESCALE SEMICONDUCTOR, INC., Austin, TX (US)

(72) Inventors: Rajesh Raina, Austin, TX (US); Magdy S. Abadir, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 113 days.

(21) Appl. No.: 14/313,192

(22) Filed: Jun. 24, 2014

(65) Prior Publication Data

US 2015/0371720 A1 Dec. 24, 2015

(51) Int. Cl.
*G11C 29/00* (2006.01)
*G11C 29/38* (2006.01)
*G11C 29/18* (2006.01)

(52) U.S. Cl.
CPC .............. *G11C 29/38* (2013.01); *G11C 29/18* (2013.01)

(58) Field of Classification Search
CPC ......... G11C 29/02; G11C 29/025; C11C 8/16
USPC ........................................................ 714/718
See application file for complete search history.

(56) References Cited

U.S. PATENT DOCUMENTS

| | | | |
|---|---|---|---|
| 5,812,469 A | 9/1998 | Nadeau-Dostie et al. | |
| 6,085,334 A | 7/2000 | Giles et al. | |
| 6,216,241 B1 * | 4/2001 | Fenstermaker | G11C 29/12 714/718 |
| 6,333,872 B1 | 12/2001 | Ouellette et al. | |
| 6,550,032 B1 * | 4/2003 | Zhao | G11C 29/025 714/730 |
| 6,681,358 B1 * | 1/2004 | Karimi | G01R 31/318558 714/733 |
| 7,139,204 B1 | 11/2006 | Behera | |
| 2015/0310933 A1 * | 10/2015 | Purushotham | G11C 29/38 714/719 |

* cited by examiner

*Primary Examiner* — David Ton
(74) *Attorney, Agent, or Firm* — Gary Stanford

(57) ABSTRACT

A system method of detecting address-swap faults in a multiport memory as described herein includes minimum testing for inversion faults and bit-swap faults for each port of the multiport memory. Different test types may be performed for inversion and bit-swap including pass/fail, and diagnostic testing for locating faulty ports. Pass/fail testing may be used for identifying whether the IC is good or bad, and additional diagnostic testing using additional cycles may be used for disabling faulty ports or correcting inverted address bits. The test method may be implemented as a function test or as a memory built-in self-test. The test method may be used during manufacturing test or during function design verification.

20 Claims, 4 Drawing Sheets

TABLE 500

| TEST TYPE | WHEN USED | TEST TIME (# OF CYCLES) | | | |
|---|---|---|---|---|---|
| | | INVERSION FAULTS TOTAL FAULTS P x n | | ADDRESS BIT-SWAP FAULTS TOTAL FAULTS P x n(n-1)/2 | |
| | | SIMULTANEOUS READ? | | SIMULTANEOUS READ? | |
| | | NO | YES | NO | YES |
| PASS/FAIL | PRODUCTION TESTING FOR DETERMINING WHETHER IC IS GOOD OR BAD; NO EVASIVE OR CORRECTIVE ACTION | 1+P | 2 | $(1+P)\log_2(n)$ | $2\log_2(n)$ |
| DIAGNOSTIC - LOCATE FAULTY PORT | DURING FIELD TESTING WHEN FAULTY PORT CAN BE DISABLED | 1+P | 2 | $(1+P)\log_2(n)$ | $2\log_2(n)$ |

SUMMARY OF TEST PROCEDURES FOR MULTI-PORT MEMORIES

FIG. 5

SYSTEM AND METHOD FOR TESTING ADDRESS-SWAP FAULTS IN MULTIPORT MEMORIES

BACKGROUND OF THE INVENTION

1. Field of the Invention

The present disclosure relates generally to memory fault testing, and more specifically to a system and method for identifying address-swap faults in multiport memories.

2. Description of the Related Art

An address "mis-decode" fault occurs when an address applied to a memory accesses a different memory location, that is, a location that is not the addressed location. An address-swap occurs when a first address ends up accessing a location of a second address, and the second address ends up accessing a location of the first address. Address mis-decode faults occur due to various defects on the address bus, such as stuck-at faults, shorts and opens. Address-swap faults occur, however, when there is an inversion fault, or when two bits of an address bus are swapped due to a design implementation error or because of faulty wiring. Defects such as shorts and opens can result in inversion faults. An inversion fault occurs when defects in a circuit result in a logic net flipping to the opposite value (e.g., actual value on a logic net is logic "1" but is flipped or inverted to a logic "0" and vice-versa).

Bit-swap faults and inversion faults were not considered an interesting class of faults for logic circuits because they are implicitly detected by conventional and existing test routines employing common fault models such as the stuck-at fault model. Bit-swap and inversion faults are undetectable for single-port memories. Such faults were considered inconsequential for single-port memories since as long as a data value is correctly stored using an address value (even if at a different location) and is correctly read out using the same address value, the single-port memory operates as intended. Bit-swap and inversion faults, however, may cause chip failure for multiport memory devices and further may be undetectable. In the case of multiport memory devices, a fault at one port causes read and/or write errors at other ports and vice-versa. Conventional test procedures or routines were unable to detect such address-swap faults in multiport memory devices.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale.

FIG. 5 is a Table of a summary of the test procedures for multi-ported memories as described herein.

DETAILED DESCRIPTION

The present inventors have recognized that existing tests do not detect address-swap faults for multiport memories. Although address-swap faults may be detected within logic circuits or single-port memories using existing test procedures, these conventional test procedures fail to detect such faults in multiport memories. The present inventors have therefore developed a test system and method that is able to detect address-swap faults in multiport memories. Specific test sequences are disclosed that are optimized for maximum efficiency and sufficient for detection of inversion and bit-swap faults. The test sequences may be added to test routines for detecting address-swap faults in any one or more ports of a multiport memory. It is assumed that a single address-swap fault occurs in a multiport memory. Any single fault is detected and is suitable for a pass/fail test. If the address-swap fault can be corrected (address inversion) or bypassed (port bypass), then additional testing may be conducted to identify additional faults.

Figure 1:
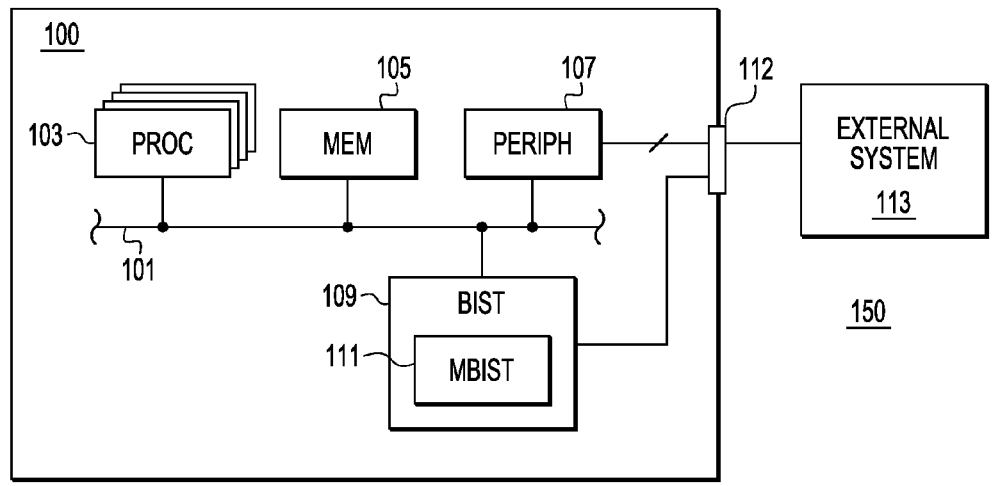
FIG. 1 is a simplified block diagram of an application system including an integrated circuit with a multiport memory and configured for testing address-swap fault according to one embodiment.

FIG. 1 is a simplified block diagram of an application system 150 including an integrated circuit (IC) 100 with a multiport memory and configured for testing address-swap fault according to one embodiment. The application system 150 includes the IC 100 and an external system 113 collectively designed to perform a particular application. In the illustrated embodiment, the application system 150 includes the IC 100 coupled to the external system 113 via one or more input/output (I/O) pins of an I/O interface 112, in which the external system 113 may include any number or amount of external devices, such as peripherals, power management devices, external memory, etc. The external system 113 generally includes the additional circuitry and functionality to fully implement the end product of the particular application. The I/O interface 112 includes any number of pins for coupling to and interfacing the external system 113. In one embodiment, the IC 100 is configured as a system-on-a-chip (SOC) configuration, although alternative configurations are contemplated. Any type of consumer, commercial, or industrial application is contemplated, including, for example, computing, networking, medical, and automotive applications.

The IC 100 includes one or more processors 103 coupled to a memory system 105 and a peripheral interface 107, which interface each other via a system interface 101. The IC 100 further includes an internal built-in self test (BIST) system 109 coupled to the system interface 101 for testing system components and functions within the IC. In one embodiment, the BIST system 109 includes a memory BIST (MBIST) system 111 for testing the memory system 105. The test system 109 may be configured to perform other test operations, such as boundary scan operations, debug operations, calibration operations, etc. In alternative configurations without BIST or MBIST functions, application test routines may be provided and executed for performing the memory test operations further described herein.

Figure 2:
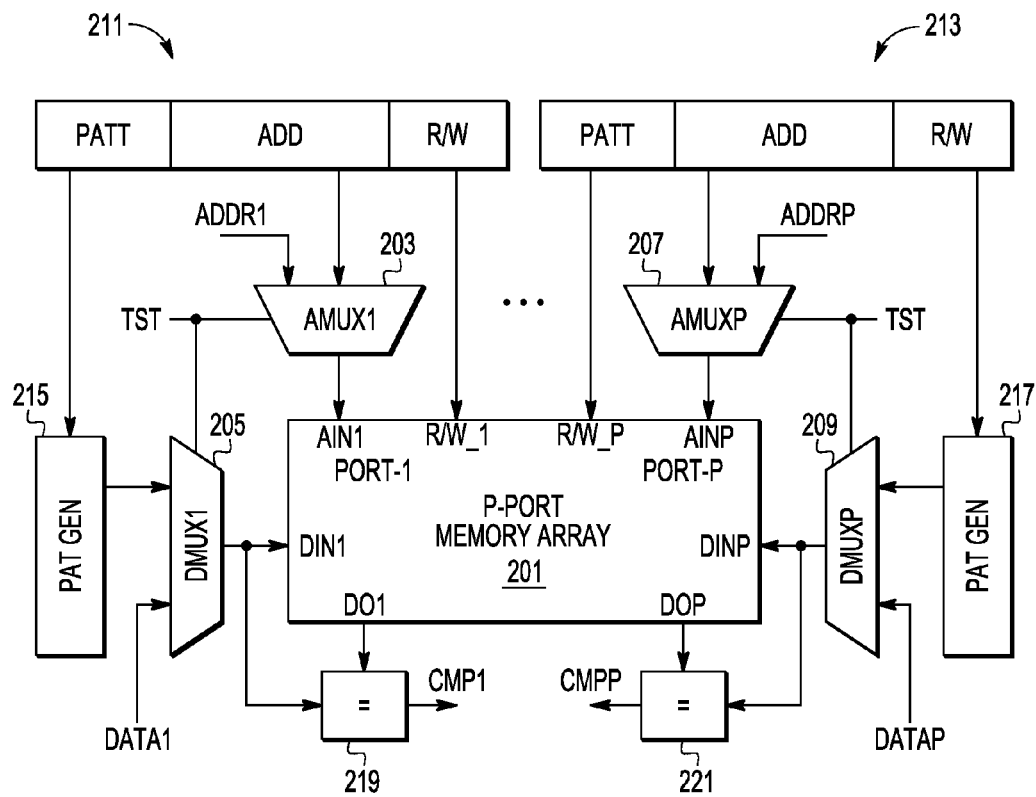
FIG. 2 is a simplified block diagram of a portion of the MBIST system of FIG. 1 interfacing a multiple port memory array incorporated within the memory system of FIG. 1.

FIG. 2 is a simplified block diagram of a portion of the MBIST system 111 interfacing a multiple port memory array 201 incorporated within the memory system 105. The interface may be direct or via the system interface 101 or any combination thereof. The memory array 201 has an integer number "P" read/write (R/W) ports for purposes of illustration, in which P is any integer greater than 1 (e.g., 2 or more ports). Only the first and last ports (ports 1 and P) are illustrated, where it is understood that P represents any number of ports of a multiport memory array. The first port PORT-1 includes an address input (AIN1), a data input (DIN1), a read/write control input (R/W_1) and a data output DO1. The last port PORT-P also includes an address input (AINP), a data input (DINP), a read/write control input (R/W_P) and a data output DOP. Additional ports, if any, are configured in substantially the same manner with similar inputs and outputs.

The memory system 105 further includes a first address multiplexer (MUX) 203 (AMUX1), a first data MUX 205 (DMUX1), a last address MUX 207 (AMUXP), a last data MUX 209 (DMUXP), and additional address and data multiplexers for any additional ports. The multiplexers are provided for switching between normal operation and test operation as indicated by a test signal TST provided to the select inputs of each of the MUXes 203, 205, 207 and 208. Although the R/W control inputs are not shown with multiplexed inputs, additional MUXes may be included for selecting between normal and test operations for the R/W input and any other control inputs. Alternatively, the active system, such as a memory controller (not shown) for operation during normal mode and the MBIST 111 for test mode simply drives the R/W signals when in the applicable mode.

The MBIST 111 includes a first memory control block 211 and a pattern generator 215 for controlling the first port PORT-1 of the memory array 201 during the test mode, a last memory control block 213 and a pattern generator 217 for controlling the last port PORT-P of the memory array 201 during the test mode, along with additional memory control blocks and pattern generators for any additional ports. The memory control block 211 includes a pattern block (PATT) storing or otherwise generating encoded test information for the test mode of operation, an address block (ADD) for providing memory addresses to a first input of MUX 203 during the test mode, and an R/W control block for asserting an R/W control signal to the R/W_1 input of the memory array 201 during the test mode. In a similar manner, the memory control block 213 includes a PATT block storing or otherwise generating encoded test information for the test mode of operation, an ADD block for providing memory addresses to a first input of MUX 207 during the test mode, and an R/W control block for asserting an R/W control signal to the R/W_P input of the memory array 201 during the test mode. The PATT block of the first memory control block 211 has an output coupled to an input of the pattern generator 215, which decodes the test information and provides a decoded test pattern at its output to one input of the MUX 205. The PATT block of the $P^{th}$ (or last) memory control block 213 has an output coupled to an input of the pattern generator 217, which decodes the test information and provides a decoded test pattern at its output to one input of the MUX 209.

MUX 203 has a second input receiving a first address signal ADDR1, and an output coupled to the AIN1 input of the memory array 201. MUX 205 has a second input receiving a first data signal DATA1, and an output coupled to the DIN1 input of the memory array 201. MBIST 111 includes a comparator 219 having a first input coupled to the output of MUX 205, a second input coupled to the DO1 output of the memory array 201, and an output providing a first compare signal CMP1. MUX 207 has a second input receiving a $P^{th}$ address signal ADDRP, and an output coupled to the AINP input of the memory array 201. MUX 209 has a second input receiving a $P^{th}$ data signal DATAP, and an output coupled to the DINP input of the memory array 201. MBIST 111 includes another comparator 221 having a first input coupled to the output of MUX 209, a second input coupled to the DOP output of the memory array 201, and an output providing a second compare signal CMPP.

During the normal mode of operation, the TST signal is logically negated so that MUX 203 selects input ADDR1 for providing an address to AIN1, MUX 205 selects DATA1 for providing data to DIN1, MUX 207 selects ADDRP for providing an address to AINP, and MUX 209 selects DATAP for providing data to DINP. During normal mode, any of the devices of the system, such as any of the processors 103 or peripherals via the peripheral interface can write data to and/or read data from the memory array 201 within the memory system 105. A write cycle to PORT-1 (or PORT-P) is performed by asserting R/W_1 (or R/W_P) to indicate a write operation, by providing an address via ADDR1 (or via ADDRP), and by providing data to be written via DATA1 (or DATAP). A read cycle from PORT-1 (or PORT-P) is performed by asserting R/W_1 (or R/W_P) to indicate a read operation, by providing an address via ADDR1 (or via ADDRP), and by reading data from the data output DO1 (or DOP). The memory array 201 may be configured to perform simultaneous read operations in which multiple ports read the same memory location at the same time.

One or more address-swap faults at either one or both of the MUX 203 and the MUX 207 may cause incorrect information to be read or written which may ultimately cause failure of the IC 100 or the application system 150. Such address-swap faults have not been detectable with conventional test procedures. Although an address-swap fault may allow correct operation if data is only read from or written to that same port (while other ports are not used or disabled), or may allow correct operation if data is read from or written to remaining non-faulty ports, the use of a faulty port along with any other port results in incorrect operation and/or failure.

During the test mode of operation, the TST signal is logically asserted so that MUX 203 selects the output of the ADD block of the memory control block 211 for providing an address to AIN1, MUX 205 selects the output of the PAT GEN block 215 for providing data to DIN1, MUX 207 selects the output of the ADD block of the memory control block 213 for providing an address to AINP, and MUX 209 selects the output of the PAT GEN block 215 for providing data to DINP. Data written to an address via PORT-1 may be compared to data read from that address by the comparator 219. Data written to an address via PORT-P may be compared to data read from that address by the comparator 221. As further described herein, a test procedure as described herein is configured to detect address-swap faults that may be caused by inversion faults or bit-swap faults.

Figure 3:
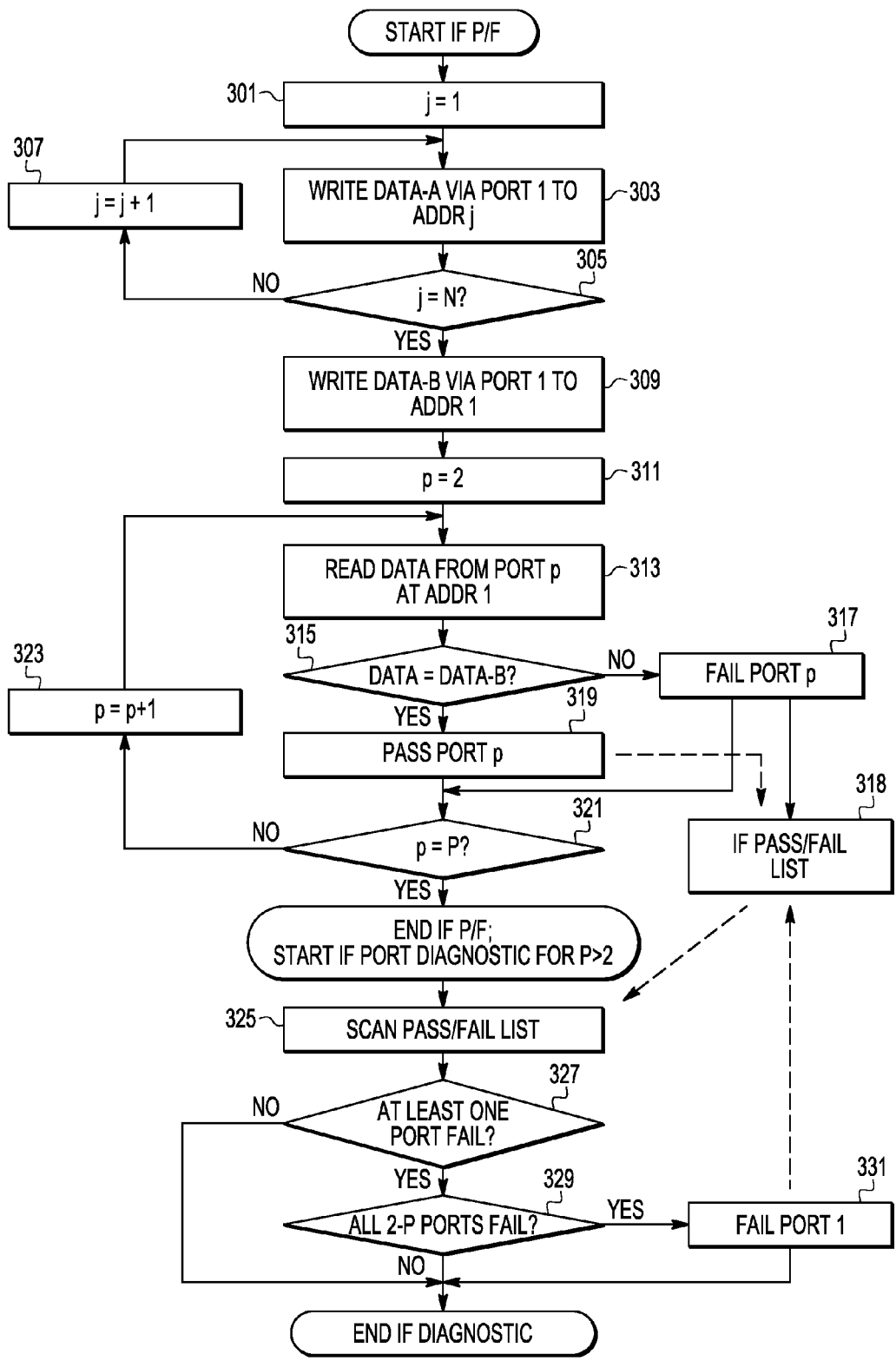
FIG. 3 is a flowchart diagram illustrating operation of an inversion fault (IF) pass/fail (P/F) test and corresponding IF port diagnostic for the memory array shown in FIG. 2.

FIG. 3 is a flowchart diagram illustrating operation of an inversion fault (IF) pass/fail (P/F) test and corresponding IF port diagnostic for the memory array 201 of the memory system 105 shown in FIG. 2. The test operations described herein may be performed by the MBIST system 111, if available, or by any other test mechanism or test operation as previously described. The TST signal is asserted during the test operations to read and write test patterns and the like as further described herein. An integer number "N" denotes the number of addressable locations of the memory array 201, in which an integer number "n" denotes the corresponding number of address bits, in which $n=LOG_2(N)$. As previously noted, P denotes the number of R/W ports of the memory array 201.

Operation of the IF P/F test starts at block 301 in which an index value "j" is initially set equal to one (1). At next block 303, an initialization procedure is started in which a data value DATA-A is written via the first port 1 to the address value ADDR j. Since j=1 in the first iteration, the data value DATA-A is written to ADDR 1. In the next block 305, it is queried whether the index j is equal to N, which is the number of addressable locations. Assuming N is greater than one, operation advances to block 307 in which the index value j is incremented, and then operation loops back to block 303 to write the same data value DATA-A to the next memory location using the next address ADDR 2. Operation continues to loop between blocks 303, 305 and 307 so that the same data value DATA-A is written to each of the N addressable memory locations.

It is noted that the initialization procedure of blocks 301-307 may be skipped if the IF P/F test is part of a larger test operation in which the memory array 201 has previously been initialized with a known data value stored at each memory location. The data value DATA-A simply represents any suitable known data value for initializing the memory array 201.

After the initialization procedure (or if the memory array 201 is already initialized), operation advances to block 309 in which a different data value DATA-B is written via the first port 1 to the first address ADDR 1. DATA-B is different from DATA-A or otherwise different from the known data value stored at each of the memory locations in the initialized memory array 201. At next block 311, a port index value "p" is set equal to two (2) in which the port index value is used to sequentially advance operation for each of the ports up to the last port, or ports 2-P. If there are only two ports, or P=2, then only one iteration is performed. At next block 313, a data value DATA is read from port "p" at the first address ADDR 1. In the first iteration, the port index p=2 so that DATA is read from port 2 at ADDR 1.

At next block 315, it is queried whether the data value DATA read at block 313 is equal to DATA-B, which is the data value previously written to ADDR 1 at block 309. If DATA is not equal to DATA-B, then there may exist an inversion fault of port p and operation advances to block 317 in which port p is indicated as failed. In one embodiment when the test is only for P/F, operation may be completed after block 317 since the IC 100 has failed the test. If further diagnostics are desired, then an IF pass/fail list 318 may be included and updated as further described herein. If instead DATA read at port p at ADDR 1 is equal to DATA-B, then operation advances to block 319 in which the port p passes.

After either block 317 or block 319, operation advances to block 321 to query whether the port index p has advanced to the total number of ports P (p=P?). If not (assuming more than 2 total ports), then operation advances to block 323 in which the port index p is incremented, and then operation loops back to block 313 to read a new data value DATA from the next port p at the first address ADDR 1. Operation loops between blocks 313, 315, 317, 319, 321 and 323 to test each of the ports 2-P to generate the IF pass/fail list 318, and operation of the IF P/F test is completed when p has been incremented to P as determined at block 321.

In one embodiment for additional diagnostics, a memory or storage mechanism, such as a table or the like, stores the IF pass/fail list 318 for each of the ports 1-P. Although not shown, the IF pass/fail list 318 may be initialized with a pass value for each of the ports. If and when a port p fails at block 317, a fail value for that port p. If instead DATA read at port p at ADDR 1 is equal to DATA-B, then operation advances to block 319 in which the port p receives a pass value. If the IF pass/fail list 318 was not previously initialized, then at block 319 port p is set to a pass value. At the end of the IF P/F test, the IF pass/fail list 318 indicates whether there are any failed ports of the memory system 105.

The IF P/F test may be used for production testing in which it is desired to determine whether the IC 100 is good (pass) or bad (fail) rather than attempting to determine specific failures (or specific failed ports) for possible evasive or corrective action. In this case, when any port fails as determined at block 317, operation is completed and the part is failed. When it is desired to further diagnose port failures and if there are more than 2 ports (P>2), then the IF pass/fail list 318 is included and populated, and operation may proceed to a block 325 in which the IF pass/fail list 318 is scanned to initiate an IF port diagnostic test. At next block 327, it is queried whether there is at least one port failure. If not, then all ports have passed and the memory system 105, or at least the memory array 201, passes the IF P/F test and IF diagnostic test is completed. If, however, there is at least one port failure, then operation advances to block 329 to query whether all of the 2-P ports (other than port 1) have failed the IF P/F test. If so, then operation advances to block 331 in which it is determined that port 1 is failed rather than the other ports 2-P, and the IF pass/fail list 318 may be updated accordingly. If at least one but not all of the ports have failed, then the IF pass/fail list 318 identifies the failed ports. After either blocks 329 or 331, the IF port diagnostic test is completed.

It is noted that if there are only 2 ports and the IF P/F test indicates failure of port 2, then the faulty signatures for both ports of the dual-port memory array are the same and hence indistinguishable. In this manner, other tests may be performed to distinguish faults between ports 1 and 2.

When there are more than 2 ports and the IF pass/fail list 318 indicates at least one failed port, then it may be possible to salvage the IC 100 by disabling the faulty port(s). For example, if the memory array 201 is implemented with 4 ports and port 4 fails, then ports 1-3 may still be used while port 4 is disabled resulting in a 3-port memory array. Accesses to port 4 are disabled or re-directed in such a manner to avoid malfunction.

Figure 4:
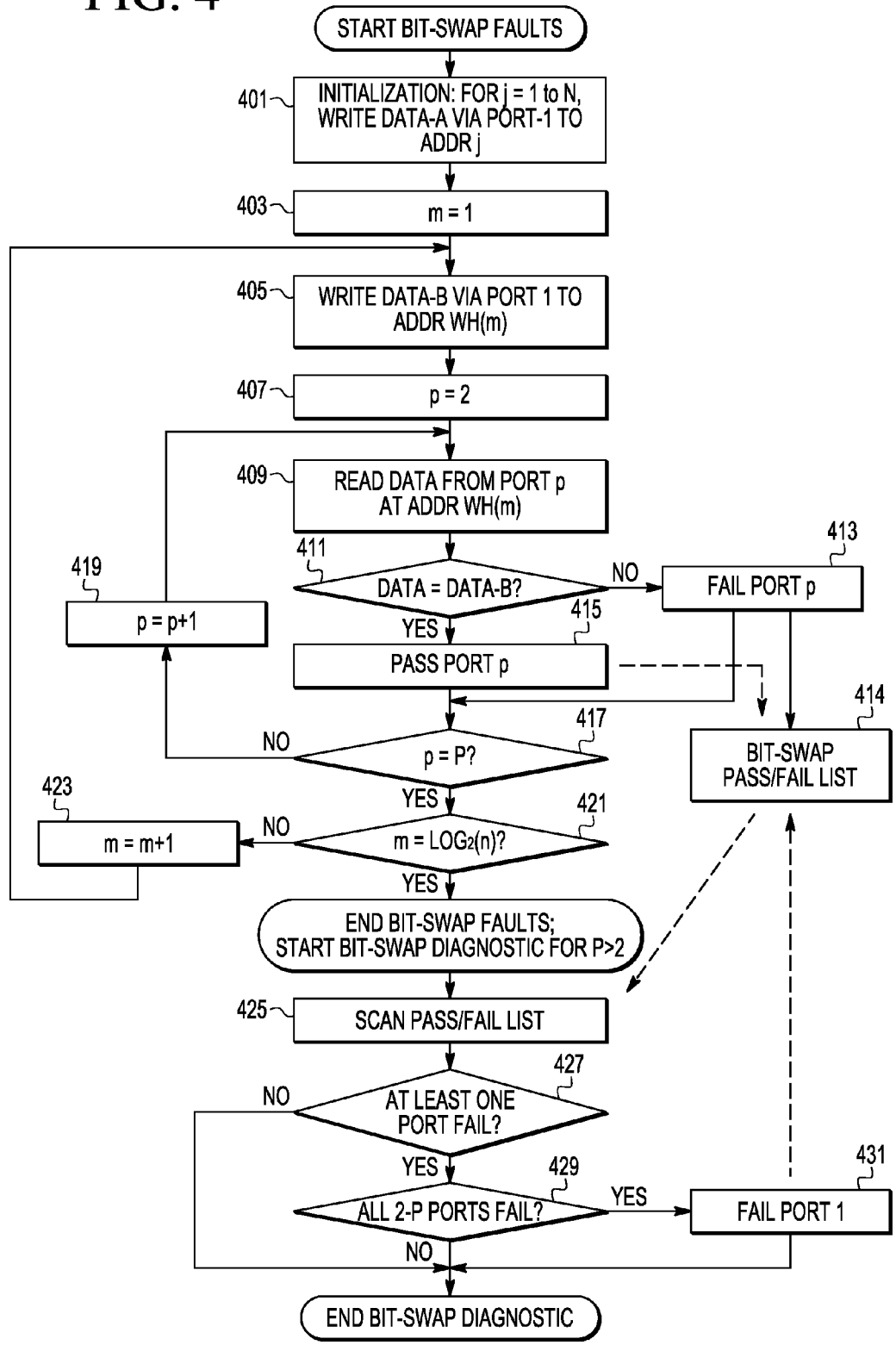
FIG. 4 is a flowchart diagram illustrating operation of bit-swap fault test and corresponding bit-swap diagnostic for the memory array shown in FIG. 2.

FIG. 4 is a flowchart diagram illustrating operation of bit-swap fault test and corresponding bit-swap diagnostic for the memory array 201 of the memory system 105 shown in FIG. 2. As previously indicated, an address-swap fault may be caused either by an inversion fault or by a bit-swap fault. At first block 401, an initialization procedure may be performed to initialize the memory locations of the memory array 201 if not already performed by other test procedures. The initialization procedure of block 401 is substantially the same as illustrated by blocks 301-307 of FIG. 3 of the IF P/F test in which a known data value, such as DATA-A, is written to each of the N memory locations.

After initialization, operation advances to block 403 in which another index value "m" is set equal to 1. Operation then proceeds to next block 405 in which a data value DATA-B is written via port 1 to an address ADDR WH(m). The notation "WH" denotes Walsh-Hadamard Codes which are repeating sequences of a number of logic 0 values followed by the same number of logic 1 values. The m index identifies a number "r" of times each logic value is repeated before switching to the opposite logic value in the sequence, in which $r=2^{(m-1)}$. As an example, for an 8-bit address, ADDR WH(1)=01010101 (in which r is 1 so that each 0 and each 1 occurs once before switching), ADDR WH(2)=00110011 (in which r is 2 so that each 0 and each 1 occurs twice before switching, i.e., repeating sequences of 00 and 11), ADDR WH(3)=00001111 (in which r is 4 so that each 0 and each 1 occurs four times before switching, i.e., repeating sequences of 0000 and 1111), and so on. Each Walsh-Hadamard Code enables detection of address bit-swaps between groups of address bits, in which the group size is determined by m. When m=1, detection may be made between adjacent bits, when m=2, detection may be made between adjacent bit pairs, when m=3, detection may be made between groups of four, and so on.

At next block 407, the port index "p" is set equal to 2 to process each of 2-P ports. At next block 409, a DATA value is read from port p at address ADDR WH(m). In the first iteration for m=1, for example, the address is ADDR<0, 1, 0, 1..., 0, 1>. At next block 411, it is queried whether the DATA value read is equal to DATA-B. Since the value DATA-B was written to the address ADDR WH(m) via port 1 at block 405, then DATA should be the same value DATA-B when read from the same address via a different port. If not, the operation advances to block 413 in which port p is indicated as failed. In a similar manner as previously described for the IF P/F test of FIG. 3, as soon as one port fails, then the IC 100 fails and operation is completed. In an alternative embodiment, a memory or storage mechanism, such as a table or the like, stores a bit-swap pass/fail list 414 for each of the ports 1-P. The bit-swap pass/fail list 414 may be initialized with pass value for each of the ports, which is updated to a fail value when a port fails the bit-swap fault test. In one embodiment, the bit-swap pass/fail list 414 may be incorporated within the same table as the IF pass/fail list 318.

If instead the data value DATA read at port p at ADDR WH(m) is equal to DATA-B as determined at block 411, then operation advances to block 415 in which the port p is indicated as passed. If the bit-swap pass/fail list 414 is included for additional diagnostic testing and was not previously initialized, then at block 415 the pass/fail entry for port p is set to a pass value. After block 415, and after block 413 if additional diagnostics are to be performed, operation advances to block 417 to query whether the port index p has advanced to the total number of ports P (p=P?). If not (assuming more than 2 total ports), then operation advances to block 419 in which the port index p is incremented, and then operation loops back to block 409 to read a new DATA value from port p at the same address ADDR WH(m). Operation loops between blocks 409, 411, 413, 415, 417, and 419 to test each of the 2-P ports to generate the bit-swap fault list 414 for address ADDR WH(m) for the current value of m.

When each of the ports have been tested for address ADDR WH(m) using the current value of m, operation advances to block 421 in which it is queried whether the index value m has reached $LOG_2(n)$, where "n" denotes the number of address bits for N addressable locations. As an example, for N=64K=65,536 addressable memory locations, n=$LOG_2(N)$=16 bits for a 16-bit address, so that m increments from 1 to $LOG_2(16)$=4. If m has not reached $LOG_2(n)$ at block 421, operation advances to block 423 in which m is incremented, and then operation loops back to block 405 in which the DATA-B value is written via port 1 to the next address in the Walsh-Hadamard Code sequence. Blocks 405 to 423 form an outer loop for each address ADDR WH(m) for m=1 to m=$LOG_2(n)$, and blocks 409-419 form an inner loop for each of ports 2-P for the address ADDR WH(m) for the current value of m. When m reaches (or exceeds) $LOG_2(n)$ at block 421, the bit-swap fault test is concluded.

At the end of the bit-swap fault test, the bit-swap pass/fail list 414, if included, indicates whether there are any failed ports of the memory system 105. Similar to the IF P/F test, the bit-swap fault test may be used for production testing in which it is desired to determine whether the IC 100 is good (pass) or bad (fail) rather than attempting to determine specific failures (or specific failed ports) for possible evasive or corrective action. When it is desired to further diagnose port failures and if there are more than 2 ports (P>2), operation may proceed to block 425 in which the bit-swap pass/fail list 414 is scanned to initiate a bit-swap diagnostic test. At next block 427, it is queried whether there are any port failures. If not, then all ports have passed and the memory system 105, or at least the memory array 201, passes the bit-swap test and bit-swap diagnostic test is completed. If, however, there is at least one port failure, then operation advances to block 429 to query whether all of the 2-P ports (other than port 1) have failed the bit-swap test. If so, then operation advances to block 431 in which it is determined that port 1 is failed rather than the other 2-P ports, and the bit-swap pass/fail list 414 may be updated accordingly and the bit-swap diagnostic test is completed. Otherwise, the bit-swap pass/fail list 414 indicates the failed ports, and the bit-swap diagnostic test is completed.

It is noted that if there are only 2 ports and the bit-swap fault test indicates failure of port 2, then the faulty signatures for both ports of the dual-port memory array are the same and hence indistinguishable. In this manner, other tests may be performed to distinguish between ports 1 and 2.

When there are more than 2 ports and the bit-swap pass/fail list 414 indicates at least one failed port, then it may be possible to salvage the IC 100 by disabling the faulty ports in a similar manner previously described for the IF P/F test.

In the event of a bit-swap fault failure detection, then further diagnosis may be performed to locate the faulty address bit-pair. For a memory array with N addressable locations and n=$LOG_2(N)$ address bits per port, then the number of possible bit-swap faults is n(n−1)/2 per port. The minimum number of cycles need to locate the faulty bit-pair is $LOG_2[n(n-1)/2]=LOG_2(n)+LOG_2(n-1)-LOG_2(2)=\sim LOG_2(n)+LOG_2(n)-1=\sim 2\ LOG_2(n)-1$. The specific test may be identified using binary search methods.

FIG. 5 is a Table 500 of a summary of the test procedures for multi-ported memories as described herein. As used in Table 500, N is the number of addressable locations in the memory, n is the corresponding number of address bits, and P is the number of R/W ports. Table 500 includes 2 test types for each of the inversion fault testing and the bit-swap fault testing. The first test type is pass/fail, such as illustrated by the IF P/F test of FIG. 3 (inversion fault testing) or the bit-swap fault test of FIG. 4 (bit-swap testing). The second test type is diagnostic testing for locating a faulty port, such as illustrated by the IF port diagnostic test of FIG. 3 (inversion fault testing) or the bit-swap diagnostic test of FIG. 4 (bit-swap testing).

The pass/fail test may be used for production testing for determining whether an IC (e.g., IC 100) is good or bad and in which evasive or corrective action may not be taken. The diagnostic testing for locating a faulty port may be used during field testing when a faulty port can be disabled or otherwise bypassed.

Table 500 lists the test time needed (in terms of the number of test cycles needed) for each test type for each of the inversion fault test (total possible faults is P×n, in which "x" denotes multiplication) and the address bit-swap fault test (total possible faults is P×n(n−1)/2. The inversion fault test and the address bit-swap fault test may each be performed with or without simultaneous read between multiple ports of the memory array. If not, then the reads for the memory array are performed one at a time. Most memory systems have layout and configurations to allow for simultaneous reads of multiple ports, although some memory systems may not be so configured or may enforce one read at a time for certain purposes, such as power considerations or the like.

As shown in Table 500, the inversion fault testing without simultaneous read (only one read per port at a time) for each test type uses 1+P cycles. If simultaneous reads are allowed, the cycles for inversion fault testing may be reduced to 2 cycles. The address bit-swap fault testing without simultaneous read for each test type uses $(1+P)LOG_2(n)$ cycles. If simultaneous reads are allowed, the cycles for address bit-swap fault testing may be reduced to $2\ LOG_2(n)$ cycles.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive logic or negative logic may be used in various embodiments in which the present invention is not limited to specific logic polarities, device types or voltage levels or the like.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method of detecting address-swap faults in a multiport memory, comprising:
    initializing each addressable location with a first data value via a first port of the multiport memory;
    writing a second data value to a first address via the first port, wherein the second data value is different from the first data value; and
    for every port of the multiport memory other than the first port:
        reading a stored data value at the first address via the port, and
        failing the port when the stored data value is not equal to the second data value.

2. The method of claim 1, wherein when the multiport memory includes more than two ports and when every port other than the first port fails, further comprising failing the first port and passing every other port.

3. The method of claim 1, further comprising storing a fail indication for each failed port in a pass/fail list.

4. The method of claim 1, further comprising:
    re-initializing each addressable location with the first data value; and
    for each address according to at least one Walsh Hadamard Code:
        writing the second data value to the address via the first port, and
        after said writing the second data value to the address via the first port, for every port other than the first port:
            reading a stored data value at the address via the port, and
            failing the port when the stored data value is not equal to the second data value.

5. The method of claim 4, wherein when the multiport memory includes more than two ports and when every port other than the first port fails, further comprising failing the first port and passing every other port.

6. The method of claim 4, further comprising storing a fail indication for each failed port in a bit-swap pass/fail list.

7. The method of claim 4, wherein each address according to the at least one Walsh Hadamard Code comprises a repeating sequence of a number of logic zero values followed by the same number of logic one values.

8. The method of claim 4, wherein the Walsh Hadamard Code is according to a function WM(m), in which m is a positive integer index value that identifies a number r of times each logic value is repeated in which $r=2^{(m-1)}$, and in which m is incremented from one to $m=LOG_2(n)$ in which n is a number of address bits.

9. A method of detecting address-swap faults in a multiport memory, comprising:
    initializing each addressable location of the multiport memory with a first data value; and
    for each address according to at least one Walsh Hadamard Code:
        writing a second data value to the address via a first port of the multiport memory; and
        after said writing the second data value to the address via the first port, for every port other than the first port:
            reading a stored data value at the address via the port, and
            failing the port when the stored data value is not equal to the second data value.

10. The method of claim 9, wherein when the multiport memory includes more than two ports and when every port other than the first port fails, further comprising failing the first port and passing every other port.

11. The method of claim 9, further comprising storing a fail indication for each failed port in a bit-swap pass/fail list.

12. The method of claim 9, wherein each address according to the at least one Walsh Hadamard Code comprises a repeating sequence of a number of logic zero values followed by the same number of logic one values.

13. The method of claim 9, wherein the Walsh Hadamard Code is according to a function WM(m), in which m is a positive integer index value that identifies a number r of times each logic value is repeated in which $r=2^{(m-1)}$, and in which m is incremented from one to $m=LOG_2(n)$ in which n is a number of address bits.

14. A memory system, comprising:
    a memory including a multiport memory; and
    a memory test system that detects address-swap faults in said multiport memory, comprising:
        a pattern generator that generates test patterns;
        an address block that provides addresses to ports of said multiport memory;
        a read/write control block that controls read and write operations of each of said ports of said multiport memory; and
        a comparator that compares a data input with a data output for each of said ports of said multiport memory; and
    wherein said memory test system is operative to:
        initialize each addressable location of said multiport memory with a first data value via a first port;
        write a second data value to a first address via said first port, wherein said second data value is different from said first data value;
        for every port other than said first port of the multiport memory:
            read a stored data value at said first address via said port, and
            fail said port when said stored data value is not equal to said second data value.

15. The memory system of claim 14, wherein said multiport memory and said memory test system are incorporated on a system-on-a-chip configuration.

16. The memory system of claim 14, wherein when said multiport memory includes more than two ports, said memory test system is further configured to fail said first port and pass said every other port when said memory test system initially determines that said every port other has failed.

17. The memory system of claim 14, wherein when said multiport memory includes more than two ports, further comprising:
- a pass/fail list stored in said memory; and
- wherein said memory test system is further configured to:
  - store a pass or fail indication in said pass/fail list,
  - scan said pass/fail list to identify ports indicated as failed, and
  - when said every port other than said first port is indicated as failed in said pass/fail list, indicating that said first port has failed and indicating that said every other port has passed in said pass/fail list.

18. The memory system of claim 14, wherein said memory test system is further operative to:
- re-initialize each addressable location with said first data value; and
- for each address according to at least one Walsh Hadamard Code:
  - write said second data value to said address via said first port, and
  - after writing said second data value to said address via said first port, for every port other than said first port:
    - read a stored data value at said address via said port, and
    - fail said port when said stored data value is not equal to said second data value.

19. The memory system of claim 18, wherein when said multiport memory includes more than two ports and when every port other than said first port fails, said memory test system is further configured to fail said first port and pass said every other port.

20. The memory system of claim 18, wherein when said multiport memory includes more than two ports, further comprising:
- a bit-swap pass/fail list; and
- wherein said memory test system is further configured to:
  - store a pass or fail indication in said bit-swap pass/fail list,
  - scan said bit-swap pass/fail list to identify ports indicated as failed, and
  - when said every port other than said first port is indicated as failed in said bit-swap pass/fail list, indicating that said first port has failed and indicating that said every other port has passed in said bit-swap pass/fail list.

* * * * *